United States Patent [19]

Kelner et al.

[11] Patent Number: 5,309,007
[45] Date of Patent: May 3, 1994

[54] JUNCTION FIELD EFFECT TRANSISTOR WITH LATERAL GATE VOLTAGE SWING (GVS-JFET)

[75] Inventors: Galina Kelner, Potomac, Md.; Michael Shur, Charlottesville, Va.

[73] Assignee: The United States of America as represented by the Secretary of the Navy, Washington, D.C.

[21] Appl. No.: 767,952

[22] Filed: Sep. 30, 1991

[51] Int. Cl.$^5$ ............. H01L 29/80; H01L 31/112; H01L 31/0312
[52] U.S. Cl. ............. 257/286; 257/77; 257/272; 257/280; 257/282
[58] Field of Search ............. 357/22 R, 22 A, 23.12, 357/23.14, 55; 437/100; 257/272, 280, 282, 286, 77

[56] References Cited

U.S. PATENT DOCUMENTS

| | | | |
|---|---|---|---|
| 4,800,172 | 1/1989 | Okano et al. | 357/22 |
| 4,914,743 | 4/1990 | Yoder et al. | 357/22 A |
| 4,929,986 | 5/1990 | Yoder | 357/22 A |
| 5,012,315 | 4/1991 | Shur | 357/23.12 |
| 5,079,620 | 1/1992 | Shur | 357/23.12 |

FOREIGN PATENT DOCUMENTS

| | | | |
|---|---|---|---|
| 0005581 | 1/1978 | Japan | 357/22 |
| 58-14576 | 1/1983 | Japan | 357/22 |
| 61-168268 | 7/1986 | Japan | 357/22 |
| 1-196177 | 8/1989 | Japan | 357/22 |
| 1-199471 | 8/1989 | Japan | 357/22 |
| 2097188A | 10/1982 | United Kingdom | 357/22 |

OTHER PUBLICATIONS

IEEE Transactions on Electron Devices, vol. 36, No. 6, Jun. 1989, "High-Transconductance B-SiC Buried-Gate JFET's" by Kelner et al., pp. 1045-1049.
IEEE Electron Device Letters, vol. EDL-8, No. 9, Sep. 1987, "B-SiC MESFET's and Buried-Gate JFET's" by Kelner et al., pp. 428-430.

*Primary Examiner*—Rolf Hille
*Assistant Examiner*—Steven Loke
*Attorney, Agent, or Firm*—Thomas E. McDonnell; Edward F. Miles

[57] ABSTRACT

A field effect transistor having a buried gate, and one or more gates disposed along the channel between the source and drain, which cooperate to cause the electric field within the channel along its length to be more uniform, and have a lower field maximum. The geometry and/or doping of the channel can be varied to selectively vary the channel resistivity along its length, which also makes the field more uniform. Because of the more uniform field, electrons are exposed to a higher field strength nearer the source, and are accelerated to higher velocities more quickly, reducing the response time and increasing the frequency range of the transistor. Because the peak field is reduced, the transistor can carry more power without reaching breakdown potential within the channel.

2 Claims, 1 Drawing Sheet

JUNCTION FIELD EFFECT TRANSISTOR WITH LATERAL GATE VOLTAGE SWING (GVS-JFET)

BACKGROUND OF THE INVENTION

This invention relates to the field of semiconductor devices, and particularly to Junction Field Effect Transistor structures for use in materials with low electron mobility and high saturation velocities.

There has been a long felt need to provide semiconductor devices capable of operating in severe environments. $\beta$ silicon carbide has a wide bandgap of 2.2 eV, a high theoretical saturated electron drift velocity of $2\times10$; cm/s, a high breakdown field of $5\times10^6$ V/cm, and a high thermal conductivity of 3.5 W/cm·°C. Silicon carbide is also relatively chemically inert and thermally stable. These properties combine to make $\beta$ silicon carbide an attractive material for high-temperature and high-power device applications.

Unfortunately, Silicon Carbide semiconductors have heretofore had a limited frequency range due to the low electron mobility of Silicon Carbide. Low mobility can normally be corrected in field effect transistors by reducing the gate length. However, because of the rudimentary fabrication technology available for silicon carbide, it is difficult to fabricate the necessary submicron gate lengths in silicon carbide. While these dimensions can be achieved by use of electron beam lithography, they are beyond the capability of conventional mass production processes using optical photolithography.

SUMMARY OF THE INVENTION

Therefore, an object of this invention is to provide a silicon carbide field effect transistor capable of operation at higher frequencies, e.g. up to a gigahertz.

Another object is to accomplish this with a device that does not require mask dimensions less than 1 micrometer.

These and other objects are provided by a field effect transistor with lateral gate voltage swing (GVS-JFET). The GVS-JFET has a buried gate layer of one conductivity type and a conducting channel layer of opposite conductivity type. The buried gate layer and the conducting channel layer have a common face. The source and a drain are on the face of the channel layer opposite the face that is common to the buried gate layer. The geometry and/or doping of the conducting channel makes the electric field in the channel between the source and drain more uniform. Because the field is more uniformly distributed, the electric field strength near the source of a GVS-JFET is greater than in prior FETs. The increased field strength accelerates electrons near the source more rapidly and thus reduces the average electron transit time.

Field effect transistors made with this invention differ from a dual gate MESFET in that a buried junction gate provides a more continuous field. They differ from a buried gate JFET in that surface Schottky gates or non-uniform conducting channels provide a more uniform electric field within the conducting channel.

Other objects, advantages, and novel features of the invention will become apparent from the following detailed description of the invention when considered in conjunction with the accompanying drawings; wherein:

BRIEF DESCRIPTION OF THE DRAWING FIGURES

FIG. 1 shows a schematic representation of a side elevational view of one embodiment of the invention.

FIG. 2 charts electric field strength versus distance under the gate for the device in FIG. 1.

FIG. 3 charts velocity versus distance under the gate for the device in FIG. 1.

Figure 1:
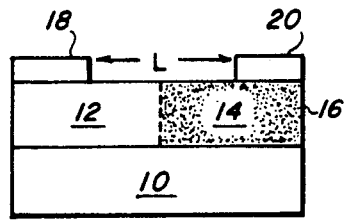

Referring now to the drawings, wherein like numbers indicate like elements throughout the several views, and in particular to FIG. 1, which shows a Field Effect Transistor according to the invention. Substrate gate 10 is p-type Silicon Carbide. Conducting regions 12 and 14 are n-type Silicon Carbide and together they make up conducting channel 16. Ions are implanted in region 14 to make it more conductive than region 12. Source 18 and drain 20 are ohmic contacts to the surface conducting channel 16 in regions 12 and 14 respectively.

Were the ions not implanted in region 14, the device would operate as a buried gate FET. See, for example, *High Transconductance $\beta$-SiC Buried Gate JFET's*, Kelner, et al., IEEE Transactions on Electron Devices, ED-36, No. 6, 1989, pp. 1045–1049. With the ions implanted in region 14, the threshold voltage (the voltage at which conduction begins) depends on the position along conducting channel 16. Thus, for a given applied gate voltage, the gate voltage swing (the difference between the gate voltage and the threshold voltage) varies along the length of the conducting channel. The greater the gate voltage swing, the more conducting the channel becomes. This relationship between position and gate voltage swing is similar to that in a split gate FET. See, for example, *Split-gate Field Effect Transistor*, Shur, Applied Physics Letters, Vol. 54, No. 2, 9 January 1989, pp 162–164.

Figure 2:
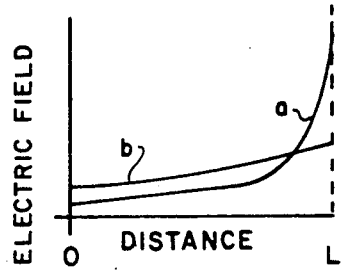
Figure 3:
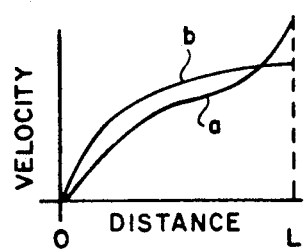

In this invention, because region 14 is more conductive than region 12, relatively more of the source-drain voltage is developed across region 12. This counteracts the unequal electric fields under the gate of a traditional FET: the electric field in region 12 is made more nearly equal to the field in region 14. FIG. 2 and FIG. 3 show the electric field and electron velocity, respectively, along distance L from source 18 towards drain 20, for both a traditional FET and an GVS-JFET. In both Figures, curve "a" represents a traditional FET device without ions implanted in region 14; "b", a GVS-JFET with ions implanted in region 14 to establish a variable gate voltage swing. In FIG. 2 the area under curves a and b are equal. Thus, when the electric field in "b" is made more even, the field near the source is strengthened, the field near the drain, weakened. Curve b is flatter than a, and lies above a close to the source. Because the electric field near source 18 is greater in b than in a, the electrons in b accelerate more quickly and have a faster average velocity. The faster average velocity in b reduces the electron transit time in a GVS-JFET. Device transconductance is a function of intra-device capacitance divided by transit time. Thus, as capacitance is constant while the transit time is reduced, transconductance increases.

Thus, conductivity along conducting channel 16 varies for the device in FIG. 1, this makes the electric field within the channel more uniform, which increases the electric field near source 18, which in turn accelerates electrons near the source more rapidly, which in turn reduces transit time and increases transconductance.

Figure 4:
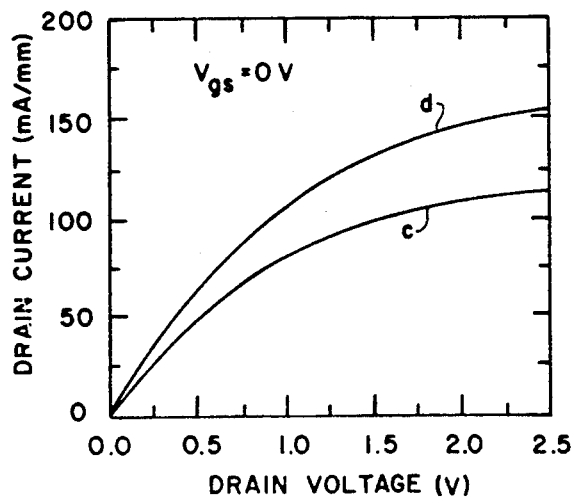
FIG. 4 shows calculated current-voltage comparisons between a conventional field effect transistor and the device of FIG. 1.

FIG. 4 shows modeled current-voltage characteristics. A conventional silicon carbide JFET, curve "c", is compared to curve "d" for a silicon carbide JFET with a variable gate voltage swing (VGS-JFET) of FIG. 1, . FIG. 4 shows that for any given drain voltage, the drain current in the VGS-JFET is greater than the drain current in a conventional JFET. The VGS-JFET delivers more power. Because the greater drain current can discharge the intra-device capacitance more quickly, the device reacts faster. Device parameters used in the calculations were a gate voltage $V_{gs}=0$; mobility $=500$ cm$^2$/Vs; saturation velocity $=2\times10^7$ cm/s; gate length $=1$ $\mu$m; threshold voltage $=-4$ V; dielectric permittivity $e =9.72$; and a built in voltage $=2.5$ V.

Figure 5:
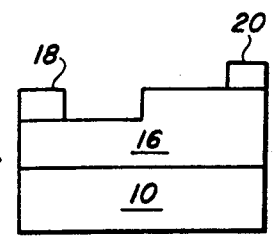
FIG. 5 shows a schematic representation of a side elevational view for a second embodiment of the invention.

In the device in FIG. 5, the thickness of conducting channel 16 is varied to vary the conductivity along the channel. Because channel thickness controls current density, and hence channel conductivity, this results in a variable gate voltage swing analogous to that achieved by ion implantation in the device in FIG. 1. The electric field and acceleration within conducting channel 16 will be of the same kind as those shown as curve "b" in FIG. 2 and FIG. 3, respectively.

The device in FIG. 5 can be fabricated by any appropriate and known method, and example of which is current controlled etching. The complete device is made with buried gate 10, conducting channel 16 (which is a uniform layer prior to etching), source 18, and drain 20. Positive voltage is then applied to the source 18 and buried gate 10 and negative voltage to drain 20. The electric field within the channel is non-uniform, being stronger near the source. The temperature is higher in the region near the source and, thus, the region near the source will have a faster etching rate. The final contour of the conducting channel can be controlled by controlling the applied voltages and the etching time.

Figure 6:
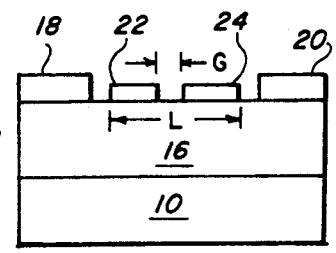
FIG. 6 shows a schematic representation of a side elevational view for a third embodiment of the invention.

The device in FIG. 6 also varies thickness to control the conductivity along conducting channel 16. However, in FIG. 6 the thickness changes uniformly rather than as a single step. Thus, conductivity gradually increases across the entire length of the conducting channel. This uniformly changing thickness provides a more uniform electric field than does the abrupt change in conductivity achieved by the discontinuous doping profiles of the devices of FIG. 1, or the abrupt difference in channel thickness of the device of FIG. 5. The more uniform electric field further increases the field strength near the source of the device in FIG. 6. The stronger electric field near source 18 gives the device in FIG. 6 better transit time and tranconductance characteristics than the devices in FIG. 1 and FIG. 5.

Figure 7:
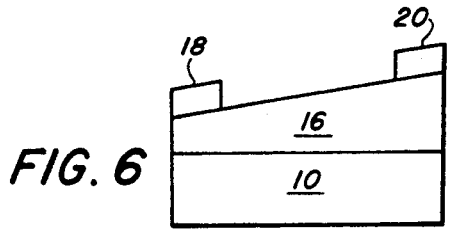
FIG. 7 shows a schematic representation of a side elevational view for a final embodiment of the invention.

The device shown in FIG. 7 evens out the electric field with plural surface gates 22 and 24 rather than structural modifications to conducting channel 16. In operation, a more positive voltage is applied to gate 24, the surface gate nearer drain 20. With a more positive voltage applied, the region under gate 24 is further from the threshold voltage and thus more conductive than the region under gate 22. This makes the region under gate 22 relatively more resistive, which increases the electric field under gate 22, which, in turn, accelerates the electrons near source is more quickly. Transconductance is increased; transit time is reduced. However, without the continuous field from buried gate 10, electrons leaving gate 22 will decelerate before reaching gate 24 if gap G is greater than the effective distance between gates 22 and 24 and conducting channel 16. Thus, gap G in prior split-gate MESFETs was limited to approximately 0.1 $\mu$m. In this invention, buried gate 10 maintains a continuous electric field so that electrons leaving gate 22 are prevented from decelerating before reaching gate 24. Gap G is need not be a small because of this invention.

The device in FIG. 7 will also work if either of gate 22 or 24 is dispensed with, and the other gate placed in an asymmetric position along length L. The single gate's position determines the voltage to be applied to it. If gate 24 is used, a positive gate voltage makes the region under gate 24 relatively more conductive. If gate 22 is used, a negative gate voltage makes the region under gate 22 relatively less conductive. In either case, the gate voltage evens out the electric field in the conducting channel. Using only a single asymmetric gate results in a device that is somewhat easier to fabricate. If the gate is placed in the position of gate 24, furthest from source 18, the increased distance from the source to gate 24 results in a higher breakdown voltage. However, a single gate will be less able to even out the electric field: transit time will not be reduced as much as with two surface gates. The opposite also holds true. With more than two gates the field is made even more uniform, electrons near the source are accelerated more quickly and obtain a higher average velocity than the devices in FIG. 1 and FIG. 5. Transit time will decrease further but the breakdown voltage will also decrease.

A buried p-gate substrate is used in all of the embodiments shown; this reduces the required number of layers. A p-type $\alpha$-silicon carbide substrate is used for gate 10 in the preferred embodiments because it eliminates the high-defect-density interface between a silicon substrate and a p-type silicon carbide gate layer. However, this invention can be made on silicon, sapphire, and other substrate materials. When the substrate is not used as gate 10, an additional layer is required for the buried gate. In all the embodiments, the maximum electric field strength in the channel is smaller, and the field is distributed along the channel more evenly, the channel can carry more power than with prior devices.

This junction field effect transistor with lateral gate voltage swing (GVS-JFET), is functional in any semiconducting material. However, its advantages result from the ability to more rapidly accelerate electrons near the source: transit time is reduced because more of the electron's transit occurs near maximum electron velocity. Materials with low saturation velocities, or with high electron mobility that allows them to easily reach maximum velocity, have less need for this structure. Thus, this invention will prove most advantageous in semiconducting materials with a low electron mobility and a high saturation velocity. Examples of such materials are diamond, silicon-carbide, indium-phosphide, gallium-arsenide, and indium-gallium-arsenide. Obviously many modifications and variations of the present invention are possible in light of the above teachings. It is therefore to be understood that within the scope of the appended claims the invention may be practiced otherwise than as specifically described.

We claim:

1. A Field Effect Transistor comprising:
   a gate layer of one conductivity type;
   a conducting channel layer of a conductivity type opposite the conductivity type of said gate layer, wherein said gate layer and said channel layer have a common face;
   a source and a drain on a face of said conducting channel layer opposite said common face; and
   a leveling means to make the electric field within said conducting channel layer more uniform between said source and said drain so as to increase the electric field strength near said source and thus accelerate electrons near said source more rapidly to increase transconductance and reduce the average electron transit time;
   wherein said gate layer is in epitaxial contact with said conducting channel layer; and
   wherein said leveling means is an increasing thickness of said conducting channel layer such that said conducting channel layer is thinner near said source than near said drain.

2. A Field Effect Transistor comprising:
   a gate layer of one conductivity type;
   a conducting channel layer of a conductivity type opposite the conductivity type of said gate layer, wherein said gate layer and said channel layer have a common face;
   a source and a drain on a face of said conducting channel layer opposite said common face; and
   a leveling means to make the electric field within said conducting channel layer more uniform between said source and said drain so as to increase the electric field strength near said source and thus accelerate electrons near said source more rapidly to increase transconductance and reduce the average electron transit time;
   wherein said gate layer is in epitaxial contact with said conducting channel layer; and
   wherein said leveling means is a single surface gate asymmetrically interposed between said source and said drain along said face of said conducting channel layer opposite said common face such that said single surface gate is closer to either said drain or said source.

* * * * *